US011515525B2

(12) United States Patent
Kleine Jaeger et al.

(10) Patent No.: US 11,515,525 B2
(45) Date of Patent: Nov. 29, 2022

(54) PROCESS FOR COATING AN OXIDE MATERIAL

(71) Applicant: BASF SE, Ludwigshafen am Rhein (DE)

(72) Inventors: Frank Kleine Jaeger, Ludwigshafen (DE); Tillmann Liebsch, Ludwigshafen (DE); Michael Schoenherr, Ludwigshafen (DE); Dominik Garella, Ludwigshafen (DE); Fatih Cetinel, Ludwigshafen (DE); Heino Sommer, Ludwigshafen (DE); Maraike Ahlf, Ludwigshafen (DE); Daniel Loeffler, Ludwigshafen (DE); Regina Vogelsang, Ludwigshafen (DE); Jacob Haag, Beachwood, OH (US)

(73) Assignee: BASF SE, Ludwigshafen (DE)

( * ) Notice: Subject to any disclaimer, the term of this patent is extended or adjusted under 35 U.S.C. 154(b) by 60 days.

(21) Appl. No.: 16/489,895

(22) PCT Filed: Feb. 21, 2018

(86) PCT No.: PCT/EP2018/054214
§ 371 (c)(1),
(2) Date: Aug. 29, 2019

(87) PCT Pub. No.: WO2018/162232
PCT Pub. Date: Sep. 13, 2018

(65) Prior Publication Data
US 2019/0393494 A1 Dec. 26, 2019

(30) Foreign Application Priority Data
Mar. 8, 2017 (EP) .................................. 17159830

(51) Int. Cl.
| | | |
|---|---|---|
| *C23C 16/44* | (2006.01) | |
| *H01M 4/36* | (2006.01) | |
| *C23C 16/442* | (2006.01) | |
| *C23C 16/455* | (2006.01) | |
| *H01M 4/505* | (2010.01) | |
| *H01M 4/525* | (2010.01) | |
| *H01M 10/0525* | (2010.01) | |
| *H01M 4/02* | (2006.01) | |

(52) U.S. Cl.
CPC ........... *H01M 4/366* (2013.01); *C23C 16/442* (2013.01); *C23C 16/4417* (2013.01); *C23C 16/45523* (2013.01); *H01M 4/505* (2013.01); *H01M 4/525* (2013.01); *H01M 10/0525* (2013.01); *H01M 2004/028* (2013.01)

(58) Field of Classification Search
None
See application file for complete search history.

(56) References Cited

U.S. PATENT DOCUMENTS

| | | | | |
|---|---|---|---|---|
| 3,136,603 A | * | 6/1964 | Klein | C01B 25/12 428/403 |
| 4,048,351 A | * | 9/1977 | Saeman | B01J 2/16 427/213 |
| 4,374,675 A | * | 2/1983 | Scotti | C09C 3/08 106/438 |
| 5,227,195 A | * | 7/1993 | Sanjurjo | D01F 11/123 427/248.1 |
| 8,993,051 B2 | | 3/2015 | Kelder et al. | |
| 2007/0248516 A1 | * | 10/2007 | Bailey | B01D 53/68 423/210 |
| 2009/0155590 A1 | * | 6/2009 | Kelder | B01J 2/16 428/403 |
| 2009/0286157 A1 | | 11/2009 | Chen et al. | |
| 2011/0236575 A1 | * | 9/2011 | King | C04B 41/81 427/214 |
| 2013/0059073 A1 | | 3/2013 | Jiang et al. | |
| 2014/0302392 A1 | | 10/2014 | Li et al. | |

(Continued)

FOREIGN PATENT DOCUMENTS

| | | | |
|---|---|---|---|
| KR | 10-2014-0006420 A | | 1/2014 |
| KR | 20140006420 | * | 1/2014 |

(Continued)

OTHER PUBLICATIONS

Ma et al., Atomic Layer Deposition of Lithium -Based Batteries, Advanced Materials Interfaces, vol. 3 No. 21, Sep. 5, 2016, 1600564, p. 1-15 (Year: 2016).*
Beetstra, Improved Li-Ion Battery Performance by Coating Cathode Nano-Particles using Atomic Layer Deposition, The 12th International Conference on Fluidization, 2007, p. 369-376 (Year: 2007).*
Valdesueiro, Gas-Phase Deposition of Ultrathin Aluminum Oxide Films on Nanoparticles at Ambient Conditions, Materials, 2015, 8, p. 1249-1263 (Year: 2015).*
King, Atomic layer deposition on particles using a fluidized bed reactor with in situ mass spectrometry, Surface and Coatings Technology, 201, 2007, p. 9163-9171 (Year: 2007).*
International Search Report dated May 29, 2018 in PCT/EP2018/054214, 4 pages.

(Continued)

*Primary Examiner* — Tabatha L Penny
(74) *Attorney, Agent, or Firm* — Finnegan, Henderson, Farabow, Garrett & Dunner LLP

(57) ABSTRACT

The present invention is related to a process for coating an oxide material, said process comprising the following steps: (a) providing a particulate material selected from lithiated nickel-cobalt aluminum oxides, lithiated cobalt-manganese oxides and lithiated layered nickel-cobalt-manganese oxides, (b) treating said cathode active material with a metal alkoxide or metal amide or alkyl metal compound, (c) treating the material obtained in step (b) with moisture, and, optionally, repeating the sequence of steps (b) and (c), wherein steps (b) and (c) are carried out in a mixer that mechanically introduces mixing energy into the particulate material, or by way of a moving bed or fixed bed, and wherein steps (b) and (c) are carried out at a pressure that is in the range of from 5 mbar to 1 bar above normal pressure.

14 Claims, No Drawings

(56) References Cited

U.S. PATENT DOCUMENTS

| | | |
|---|---|---|
| 2015/0023855 A1* | 1/2015 | Laslo .................. B01D 53/185 423/220 |
| 2015/0031157 A1 | 1/2015 | Elam et al. |
| 2015/0152549 A1 | 6/2015 | King et al. |
| 2015/0162606 A1 | 6/2015 | Kelder et al. |
| 2015/0259794 A1 | 9/2015 | King et al. |
| 2016/0226057 A1 | 8/2016 | Kelder et al. |
| 2016/0351973 A1 | 12/2016 | Albano et al. |
| 2017/0088946 A1 | 3/2017 | King et al. |
| 2017/0282140 A1 | 10/2017 | Kelder et al. |

FOREIGN PATENT DOCUMENTS

| | | | |
|---|---|---|---|
| KR | 20140006420 A | * | 1/2014 |
| WO | WO-2016021614 A1 | * | 2/2016 ............. G01R 31/36 |
| WO | WO 2016/205242 A1 | | 12/2016 |
| WO | WO 2018/019627 A1 | | 2/2018 |
| WO | WO 2018/162234 A1 | | 9/2018 |

OTHER PUBLICATIONS

Extended European Search Report dated May 19, 2017 in Patent Application No. 17159830.3, 3 pages.

Ma, L. et al. "Atomic Layer Deposition for Lithium-Based Batteries" Advanced Materials Interface, vol. 3, No. 21, XP055368860, 2016, 15 pages.

George, S.M. "Atomic Layer Deposition: An Overview" Chemical Reviews, No. 110, XP002680656, 2010, 21 pages.

* cited by examiner

PROCESS FOR COATING AN OXIDE MATERIAL

The present invention is related to a process for coating an oxide material, said process comprising the following steps:
(a) providing a particulate material selected from lithiated nickel-cobalt aluminum oxides, lithiated cobalt-manganese oxides and lithiated layered nickel-cobalt-manganese oxides,
(b) treating said cathode active material with a metal alkoxide or metal amide or alkyl metal compound,
(c) treating the material obtained in step (b) with moisture, and, optionally, repeating the sequence of steps (b) and (c),
wherein steps (b) and (c) are carried out in a mixer that mechanically introduces mixing energy into the particulate material, or by way of a moving bed or fixed bed, and
wherein steps (b) and (c) are carried out at a pressure that is in the range of from 5 mbar to 1 bar above normal pressure.

Lithium ion secondary batteries are modern devices for storing energy. Many application fields have been and are contemplated, from small devices such as mobile phones and laptop computers through car batteries and other batteries for e-mobility. Various components of the batteries have a decisive role with respect to the performance of the battery such as the electrolyte, the electrode materials, and the separator. Particular attention has been paid to the cathode materials. Several materials have been suggested, such as lithium iron phosphates, lithium cobalt oxides, and lithium nickel cobalt manganese oxides. Although extensive research has been performed the solutions found so far still leave room for improvement.

One problem of lithium ion batteries lies in undesired reactions on the surface of the cathode active materials. Such reactions may be a decomposition of the electrolyte or the solvent or both. It has thus been tried to protect the surface without hindering the lithium exchange during charging and discharging. Examples are attempts to coat the cathode active materials with, e.g., aluminium oxide or calcium oxide, see, e.g., U.S. Pat. No. 8,993,051.

The efficiency of the process, however, may still be improved. Especially in embodiments wherein the particles have a tendency to agglomerate the efficiency sometimes leaves room for improvement both in respect to reaction time and percentage of covered particles as well as percentage of coverage of particles.

It was therefore an objective of the present invention to provide a process by which particulate materials may be coated without an unduly long reaction time wherein such particulate materials have a tendency to form agglomerates. It was further an objective to provide a reactor for performing such a process.

Accordingly, the process as defined at the outset has been found, hereinafter also referred to as inventive process or as process according to the (present) invention. The inventive process is a process for coating a particulate material.

Coated materials as obtained in the context with the present invention refer to at least 80% of the particles of a batch of particulate material being coated, and to at least 75% of the surface of each particle being coated, for example 75 to 99.99% and preferably 80 to 90%.

The thickness of such coating may be very low, for example 0.1 to 5 nm. In other embodiments, the thickness may be in the range of from 6 to 15 nm. In further embodiments, the thickness of such coating is in the range of from 16 to 50 nm. The thickness in this context refers to an average thickness determined mathematically by calculating the amount of thickness per particle surface and assuming a 100% conversion.

Without wishing to be bound by any theory, it is believed that non-coated parts of particles do not react due to specific chemical properties of the particles, for example density of chemically reactive groups such as, but not limited to hydroxyl groups, oxide moieties with chemical constraint, or to adsorbed water.

In one embodiment of the present invention the particulate material has an average particle diameter (D50) in the range of from 3 to 20 μm, preferably from 5 to 16 μm. The average particle diameter can be determined, e. g., by light scattering or LASER diffraction. The particles are usually composed of agglomerates from primary particles, and the above particle diameter refers to the secondary particle diameter.

In one embodiment of the present invention, the particulate material has a BET surface in the range of from 0.1 to 1 m²/g. the BET surface may be determined by nitrogen adsorption after outgassing of the sample at 200° C. for 30 minutes or more and beyond this accordance with DIN ISO 9277:2010.

The inventive process comprises three steps (a), (b) and (c), in the context of the present invention also referred to as step (a), step (b) and step (c).

Step (a) includes providing a particulate material selected from lithiated nickel-cobalt aluminum oxides, and lithiated cobalt-manganese oxide. Examples of lithiated layered cobalt-manganese oxides are $Li_{1+x}(Co_eMn_fM^4{}_d)_{1-x}O_2$. Examples of layered nickel-cobalt-manganese oxides are compounds of the general formula $Li_{1+x}(Ni_aCo_bMn_cM^4{}_d)_{1-x}O_2$, with $M^4$ being selected from Mg, Ca, Ba, Al, Ti, Zr, Zn, Mo, V and Fe, the further variables being defined as follows:

zero≤x≤0.2
0.1≤a≤0.8,
zero≤b≤0.5,
0.1≤c≤0.6,
zero≤d≤0.1, and a+b+c+d=1.

In a preferred embodiment, in compounds according to general formula (I)

$$Li_{(1+x)}[Ni_aCo_bMn_cM^4{}_d]_{(1-x)}O_2 \qquad (I)$$

$M^4$ is selected from Ca, Mg, Al and Ba,
and the further variables are defined as above.

In $Li_{1+x}(Co_eMn_fM^4{}_d)_{1-x}O_2$, e is in the range of from 0.2 to 0.8, f is in the range of from 0.2 to 0.8, the variables $M^4$ and d and x are as defined above, and e+f+d=1.

Examples of lithiated nickel-cobalt aluminum oxides are compounds of the general formula $Li[Ni_hCo_iAl_j]O_{2+r}$. Typical values for r, h, i and j are:
h is in the range of from 0.8 to 0.90,
i is in the range of from 0.05 to 0.19,
j is in the range of from 0.01 to 0.05, and
r is in the range of from zero to 0.4.

Particularly preferred are $Li_{(1+x)}[Ni_{0.33}Co_{0.33}Mn_{0.33}]_{(1-x)}O_2$, $Li_{(1+x)}[Ni_{0.5}Co_{0.2}Mn_{0.3}]_{(1-x)}O_2$, $Li_{(1+x)}[Ni_{0.6}Co_{0.2}Mn_{0.2}]_{(1-x)}O_2$, $Li_{(1+x)}[Ni_{0.7}Co_{0.2}Mn_{0.1}]_{(1-x)}O_2$, and $Li_{(1+x)}[Ni_{0.8}Co_{0.1}Mn_{0.1}]_{(1-x)}O_2$, each with x as defined above.

Said particulate material is preferably provided without any additive such as conductive carbon or binder but as free-flowing powder.

In one embodiment of the present invention particles of particulate material such as lithiated nickel-cobalt aluminum oxide or layered lithium transition metal oxide, respectively, are cohesive. That means that according to the Geldart grouping, the particulate material is difficult to fluidize and therefore qualifies for the Geldart C region. In the course of the present invention, though, mechanical stirring is not required in all embodiments.

Further examples of cohesive products are those with a flowability factor $ff_c \leq 7$, preferably $1 < ff_c \leq 7$ ($ff_c = \sigma_1/\sigma_c$; $\sigma_1$—major principle stress, $\sigma_c$,—unconfined yield strength) according to Jenike or those with a Hausner ratio $f_H \geq 1.1$, preferably $1.6 \geq f_H \geq 1.1$ ($f_H = \rho_{tap}/\rho_{bulk}$; $\rho_{tap}$—tapped density measured after 1250 strokes in jolting volumeter, $\rho_{bulk}$—bulk density according to DIN EN ISO 60).

In step (b) of the inventive process, the particulate material provided in step (a) is treated with a metal alkoxide or metal amide or alkyl metal compound. The treatment will be described in more detail below.

Steps (b) and (c) of the inventive process are performed in a vessel or a cascade of at least two vessels, said vessel or cascade—if applicable—also being referred to as reactor in the context of the present invention. Preferably, steps (b) and (c) are performed in the same vessel.

In one embodiment of the inventive process, step (b) is performed at a temperature in the range of from 15 to 1000° C., preferably 15 to 500° C., more preferably 20 to 350° C., and even more preferably 150 to 200° C. It is preferred to select a temperature in step (b) at which metal alkoxide or metal amide or alkyl metal compound, as the case may be, is in the gas phase.

Step (b) is carried out at a pressure above normal pressure. Thus, step (b) is carried out at a pressure in the range of from 5 mbar to 1 bar above normal pressure, preferably 10 to 150 mbar above normal pressure and more preferably 10 to 560 mbar above normal pressure. In the context of the present invention, normal pressure is 1 atm or 1013 mbar.

In a preferred embodiment of the present invention, alkyl metal compound or metal alkoxide or metal amide, respectively, is selected from $M^1(R^1)_2$, $M^2(R^1)_3$, $M^3(R^1)_{4-y}H_y$, $M^1(OR^2)_2$, $M^2(OR^2)_3$, $M^3(OR^2)_4$, $M^3[NR^2)_2]_4$, and methyl alumoxane, wherein $R^1$ are different or equal and selected from $C_1$-$C_8$-alkyl, straight-chain or branched, $R^2$ are different or equal and selected from $C_1$-$C_4$-alkyl, straight-chain or branched, $M^1$ is selected from Mg and Zn, $M^2$ is selected from Al and B, $M^3$ is selected from Si, Sn, Ti, Zr, and Hf, with Sn and Ti being preferred, the variable y is selected from zero to 4, especially zero and 1.

Metal alkoxides may be selected from $C_1$-$C_4$-alkoxides of alkali metals, preferably sodium and potassium, alkali earth metals, preferably magnesium and calcium, aluminum, silicon, and transition metals. Preferred transition metals are titanium and zirconium. Examples of alkoxides are methanolates, hereinafter also referred to as methoxides, ethanolates, hereinafter also referred to as ethoxides, propanolates, hereinafter also referred to as propoxides, and butanolates, hereinafter also referred to as butoxides. Specific examples of propoxides are n-propoxides and isopropoxides. Specific examples of butoxides are n-butoxides, iso-butoxides, sec.-butoxides and tert.-butoxides. Combinations of alkoxides are feasible as well.

Examples of alkali metal alkoxides are $NaOCH_3$, $NaOC_2H_5$, $NaO$-iso-$C_3H_7$, $KOCH_3$, $KO$-iso-$C_3H_7$, and $K$—$O$—$C(CH_3)_3$.

Preferred examples of metal $C_1$-$C_4$-alkoxides are $Si(OCH_3)_4$, $Si(OC_2H_5)_4$, $Si(O$-n-$C_3H_7)_4$, $Si(O$-iso-$C_3H_7)_4$, $Si(O$-n-$C_4H_9)_4$, $Ti[OCH(CH_3)_2]_4$, $Ti(OC_4H_9)_4$, $Zn(OC_3H_7)_2$, $Zr(OC_4H_9)_4$, $Zr(OC_2H_5)_4$, $Al(OCH_3)_3$, $Al(OC_2H_5)_3$, $Al(O$-n-$C_3H_7)_3$, $Al(O$-iso-$C_3H_7)_3$, $Al(O$-sec.-$C_4H_9)_3$, and $Al(OC_2H_5)(O$-sec.-$C_4H_9)_2$.

Examples of metal alkyl compounds of an alkali metal selected from lithium, sodium and potassium, with alkyl lithium compounds such as methyl lithium, n-butyl lithium and n-hexyl lithium being particularly preferred. Examples of alkyl compounds of alkali earth metals are di-n-butyl magnesium and n-butyl-n-octyl magnesium ("BOMAG"). Examples of alkyl zinc compounds are dimethyl zinc and zinc diethyl.

Examples of aluminum alkyl compounds are trimethyl aluminum, triethyl aluminum, triisobutyl aluminum, and methyl alumoxane.

Metal amides are sometimes also referred to as metal imides. Examples of metal amides are $Na[N(CH_3)_2]$, $Li[N(CH_3)_2]$ and $Ti[N(CH_3)_2]_4$.

Particularly preferred compounds are selected from metal $C_1$-$C_4$-alkoxides and metal alkyl compounds, and even more preferred is trimethyl aluminum.

In one embodiment of the present invention, the amount of metal alkoxide or metal amide or alkyl metal compound is in the range of 0.1 to 1 g/kg particular material.

Preferably, the amount of metal alkoxide or metal amide or alkyl metal compound, respectively, is calculate to amount to 80 to 200% of a monomolecular layer on the particular material per cycle.

In a preferred embodiment of the present invention, the duration of step (b) is in the range of from 1 second to 2 hours, preferably 1 second up to 10 minutes.

In a third, optional step, in the context of the present invention also referred to as step (c), the material obtained in step (b) is treated with moisture.

In one embodiment of the present invention, step (c) is carried out at a temperature in the range of from 50 to 250° C.

Step (c) is carried out at a pressure above normal pressure. Thus, step (c) is carried out at a pressure in the range of from 5 mbar to 1 bar above normal pressure, preferably 10 to 50 mbar above normal pressure. In the context of the present invention, normal pressure is 1 atm or 1013 mbar.

Steps (b) and (c) may be carried out at the same pressure or at different pressures, preferred is at the same pressure.

Said moisture may be introduced, e.g., by treating the material obtained in accordance with step (b) with moisture saturated inert gas, for example with moisture saturated nitrogen or moisture saturated noble gas, for example argon. Saturation may refer to normal conditions or to the reaction conditions in step (c).

Although said step (c) may be replaced by a thermal treatment at a temperature in the arrange of from 150° C. to 600° C., preferable 250° C. to 450° C. it is preferred to carry out said step as indicated above.

On one embodiment of the present invention, step (c) has a duration in the range of from 10 seconds to 2 hours, preferable 1 second to 10 minutes.

In one embodiment, the sequence of steps (b) and (c) is carried out only once. In a preferred embodiment, the sequence of steps (b) and (c) is repeated, for example once or twice or up to 40 times. It is preferred to carry out the sequence of steps (b) and (c) two to six times.

Steps (b) and (c) of the inventive process may be carried out continuously or batch-wise.

In one embodiment of the present invention, the reactor in which the inventive process is carried out is flushed or purged with an inert gas between steps (b) and (c), for example with dry nitrogen or with dry argon. Suitable flushing—or purging—times are 1 second to 30 minutes, preferably 1 minute to 10 minutes. It is preferred that the amount of inert gas is sufficient to exchange the contents of the reactor of from one to 15 times. By such flushing or purging, the production of by-products such as separate particles of reaction product of metal alkoxide or metal amide or alkyl metal compound, respectively, with water can be avoided. In the case of the couple trimethyl aluminum and water, such by-products are methane and alumina or trimethyl aluminum that is not deposited on the particulate material, the latter being an undesired by-product.

Various embodiments of reactor design are possible to perform the steps (b) and (c) of the inventive process. Steps (b) and (c) are carried out in a mixer that mechanically introduces mixing energy into the particulate material, for example compulsory mixers and free-fall mixers. While free fall mixers utilize the gravitational forces for moving the particles compulsory mixers work with moving, in particular rotating mixing elements that are installed in the mixing room. In the context of the present invention, the mixing room is the reactor interior. Examples of compulsory mixers are ploughshare mixers, in German also called Lödige mixers, paddle mixers and shovel mixers. Preferred are ploughshare mixers. Ploughshare mixers may be installed vertically or horizontally, the term horizontal or vertical, respectively, referring to the axis around which the mixing element rotates. Horizontal installation is preferred. Preferably, the inventive process is carried out in a ploughshare mixer in accordance with the hurling and whirling principle.

In another embodiment of the present invention, the inventive process may be carried out in a free fall mixer. Free fall mixers are using the gravitational force to achieve mixing. In a preferred embodiment, steps (b) and (c) of the inventive process are carried out in a drum or pipe-shaped vessel that rotates around its horizontal axis. In a more preferred embodiment, steps (b) and (c) of the inventive process are carried out in a rotating vessel that has baffles.

In one embodiment of the present invention a vessel or at least parts of it rotates with a speed in the range of from 5 to 500 revolutions per minute ("rpm"), preferred are 5 to 60 rpm. In embodiments wherein a free-fall mixer is applied, from 5 to 25 rpm are more preferred and 5 to 10 rpm are even more preferred. In embodiments wherein a ploughshare mixer is applied, 50 to 400 rpm are preferred and 100 to 250 rpm are even more preferred.

In another embodiment of the present invention, steps (b) and (c) are carried out by way of a moving bed or fixed bed. In a fixed bed process, the particulate material provided in step (a) is placed upon a porous area, for example a sieve plate. Hereby, particulate material provided in step (a) forms a bed. In step (b) a medium, especially an inert gas containing a metal alkoxide or metal amide or alkyl metal compound flows from top to bottom through the bed, and in step (c), moisture, e.g., in the form of humid nitrogen or humid air, from bottom to top or from top to bottom through the bed.

In a moving bed process, particulate material provided in step (a) are introduced at the top of a tubular reactor, thereby automatically forming a particle bed. A gas stream containing a metal alkoxide or metal amide or alkyl metal compound flows bottom-up through said bed with a gas velocity that is not sufficient to keep the particle bed in a steady state. Instead, the particle bed moves counter-currently with the gas stream (step (b). Step (c) is carried out accordingly but with moisture instead of metal alkoxide or metal amide or alkyl metal.

In a preferred version of the present invention, which allows for the pneumatic conveying of said particulate material, a pressure difference up to 4 bar is applied. Coated particles may be blown out of the reactor or removed by suction.

In one embodiment of the present invention, the inlet pressure is higher but close to the desired reactor pressure. Pressure drops of gas inlet and in the moving or fixed bed, if applicable, have to be compensated.

In the course of the inventive process strong shear forces are introduced into the fluidized bed due to the shape of the reactor, the particles in the agglomerates are exchanged frequently, which allows for the accessibility of the full particle surface. By the inventive process, particulate materials may be coated in short time, and in particular cohesive particles may be coated very evenly.

In a preferred embodiment of the present invention the inventive process comprises the step of removing the coated material from the vessel or vessels, respectively, by pneumatic convection, e.g. 20 to 100 m/s.

In one embodiment of the present invention, the exhaust gasses are treated with water at a pressure above normal pressure and even more preferably slightly lower than in the reactor in which steps (b) and (c) are performed, for example in the range of from 2 mbar to 1 bar more than normal pressure, preferably in the range of from 4 mbar to 25 mbar above normal pressure. The elevated pressure is advantageous to compensate for the pressure loss in the exhaust lines.

The sealings necessary for separating the reactor and the exhaust gas treatment vessel from the environment are advantageously equipped with nitrogen flushing.

In one embodiment of the present invention, the gas inlet and the outlet are at opposite positions of the vessel used for the inventive process.

By the inventive process, particulate materials may be coated in short time, and in particular cohesive particles may be coated very evenly. The inventive process allows for good safety because any combustible or even explosive atmosphere may be easily avoided.

The progress of the inventive process may be controlled by mass spectrometry.

The invention claimed is:
1. A process for coating an oxide material, comprising:
(a) providing a particulate material chosen from lithiated nickel-cobalt aluminum oxides according to formula $Li[Ni_hCo_iAl_j]O_{2+r}$, lithiated cobalt-manganese oxides according to formula $Li_{1+x}(Co_eMn_fM^4_d)_{1-x}O_2$ and lithiated layered nickel-cobalt-manganese oxides according to formula $Li_{(1+x)}[Ni_aCo_bMn_cM^4_d]_{(1-x)}O_2$,
(b) treating the particulate material with a metal alkoxide, metal amide, or alkyl metal compound,
(c) treating the material obtained in (b) with moisture, and, optionally, repeating the sequence of (b) and (c),
wherein (b) and (c) are carried out in a vessel or cascade of at least tow vessels using a mixer that mechanically introduces mixing energy into the particulate material, or by way of a moving bed, or fixed bed, and
wherein (b) and (c) are carried out at a pressure ranging from 5 mbar to 1 bar above 1 atm,
wherein:
$M^4$ is chosen from Mg, Ca, Ba, Al, Ti, Zr, Zn, Mo, V and Fe,
zero$\leq x \leq 0.2$,
$0.1 \leq a \leq 0.8$,
zero$\leq b \leq 0.5$,
$0.1 \leq c \leq 0.6$, zero≤d≤0.1, and a+b+c+d=1,
e is in a range of from 0.2 to 0.8,
f is in a range of from 0.2 to 0.8, and e+f+d=1,
h is in a range of from 0.8 to 0.90,
i is in a range of from 0.15 to 0.19,
j is in a range of from 0.01 to 0.05, and
r is in a range of from zero to 0.4; and
wherein particles of lithiated nickel-cobalt aluminum oxide or lithiated layered nickel-cobalt-manganese oxide, respectively, are cohesive having a Geldart C grouping: and
wherein particles of lithiated nickel-cobalt aluminum oxide or lithiated layered nickel-cobalt-manganese oxide, respectively, are cohesive having a flowability factor $ff_c \leq 7$.

2. The process according to claim 1, wherein the mixer that mechanically introduces mixing energy into the particulate material is a compulsory mixer or a free-fall mixer.

3. The process according to claim 1, wherein the alkyl metal compound, metal alkoxide, or metal amide has a formula chosen from $M^1(R^1)_2$, $M^2(R^1)_3$, $M^3(R^1)_{4-y}H_y$, $M^1(OR^2)_2$, $M^2(OR^2)_3$, $M^3(OR^2)_4$, $M^3[NR^2)_2]_4$, and methyl alumoxane wherein:

$R^1$ are each independently chosen from straight-chain $C_1$-$C_8$-alkyl and branched $C_1$-$C_8$-alkyl,
$R^2$ are each independently chosen from straight-chain $C_1$-$C_4$-alkyl and branched $C_1$-$C_8$-alkyl,
$M^1$ is Mg or Zn,
$M^2$ is Al or B,
$M^3$ is chosen from Si, Sn, Ti, Zr, and Hf, and
the variable y ranges from zero to 4.

4. The process according to claim 1, wherein (b) is performed at 10 mbar to 150 mbar above 1 bar.

5. The process according to claim 1, wherein (b) and (c) are performed in a rotating vessel that has baffles.

6. The process according to claim 1, further comprising treating exhaust gases with water at a pressure above 1 atm.

7. The process according to claim 6, wherein the exhaust gases are treated with water at a pressure ranging from 5 mbar to 1 bar above 1 atm.

8. The process according to claim 1, wherein (b) is performed at a temperature in a range of from 15° C. to 350° C.

9. The process according to claim 1, further comprising flushing a reactor with an inert gas between (b) and (c).

10. The process according to claim 1, further comprising removing the coated oxide material from the vessel or vessels, respectively, by pneumatic convection.

11. The process according to claim 1, wherein the particulate material has an average particle diameter (D50) ranging from 3 μm to 20 μm.

12. The process according to claim 1, wherein the particulate material has a BET surface area ranging from 0.1 m²/g to 1 m²/g.

13. The process according to claim 1, wherein the amount of metal alkoxide or metal amide or alkyl metal compound ranges from 0.1 g to 1 g per 1 kg of the particulate material.

14. The process according to claim 1, wherein progress of the process is controlled by mass spectrometry.

* * * * *